(12) United States Patent
Tomioka et al.

(10) Patent No.: US 10,514,563 B2
(45) Date of Patent: *Dec. 24, 2019

(54) DISPLAY DEVICE

(71) Applicant: Japan Display Inc., Minato-ku (JP)

(72) Inventors: Yasushi Tomioka, Tokyo (JP); Hajime Yamaguchi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/374,802

(22) Filed: Apr. 4, 2019

(65) Prior Publication Data

US 2019/0227367 A1    Jul. 25, 2019

Related U.S. Application Data

(63) Continuation of application No. 15/631,300, filed on Jun. 23, 2017, now Pat. No. 10,302,980.

(30) Foreign Application Priority Data

Jun. 24, 2016    (JP) .................................. 2016-125569

(51) Int. Cl.
| | |
|---|---|
| *G06F 3/041* | (2006.01) |
| *G02F 1/1333* | (2006.01) |
| *G02F 1/1362* | (2006.01) |
| *H01L 51/52* | (2006.01) |
| *G02F 1/1345* | (2006.01) |
| *H01L 27/32* | (2006.01) |
| *H01L 51/50* | (2006.01) |

(52) U.S. Cl.
CPC .... *G02F 1/133305* (2013.01); *G02F 1/13452* (2013.01); *G02F 1/136286* (2013.01); *H01L 27/3276* (2013.01); *H01L 51/5234* (2013.01); *G02F 1/136227* (2013.01); *H01L 51/5012* (2013.01); *H01L 2251/5338* (2013.01)

(58) Field of Classification Search
CPC ........... G02F 1/133305; G02F 1/13452; G02F 1/136286; G02F 1/136227; H01L 27/3276; H01L 51/5234; H01L 2251/5338; H01L 51/5012
See application file for complete search history.

(56) References Cited

U.S. PATENT DOCUMENTS

| | | |
|---|---|---|
| 2010/0025083 A1 | 2/2010 | Yang |
| 2011/0292313 A1 | 12/2011 | Takenaka |
| 2014/0328031 A1 | 11/2014 | Yang |
| 2014/0353670 A1 | 12/2014 | Youn et al. |
| 2015/0287750 A1 | 10/2015 | Youn et al. |
| 2016/0093685 A1 | 3/2016 | Kwon |

FOREIGN PATENT DOCUMENTS

JP    2014-232300    12/2014

*Primary Examiner* — Adam R. Giesy
(74) *Attorney, Agent, or Firm* — Oblon, McClelland, Maier & Neustadt, L.L.P.

(57) ABSTRACT

According to one embodiment, a display device includes a first substrate and an external circuit, the first substrate including a first area, a second area, and wirings, the first area including a display area in which pixels are arranged the external circuit being mounted on the second area. The wirings are electrically connected to the external circuit, provided in the first area and the second area, and arranged in the first direction. At least one of the wirings is inclined with respect to a second direction orthogonal to the first direction in a first portion of the second area. The first substrate is bent in the first portion.

18 Claims, 9 Drawing Sheets

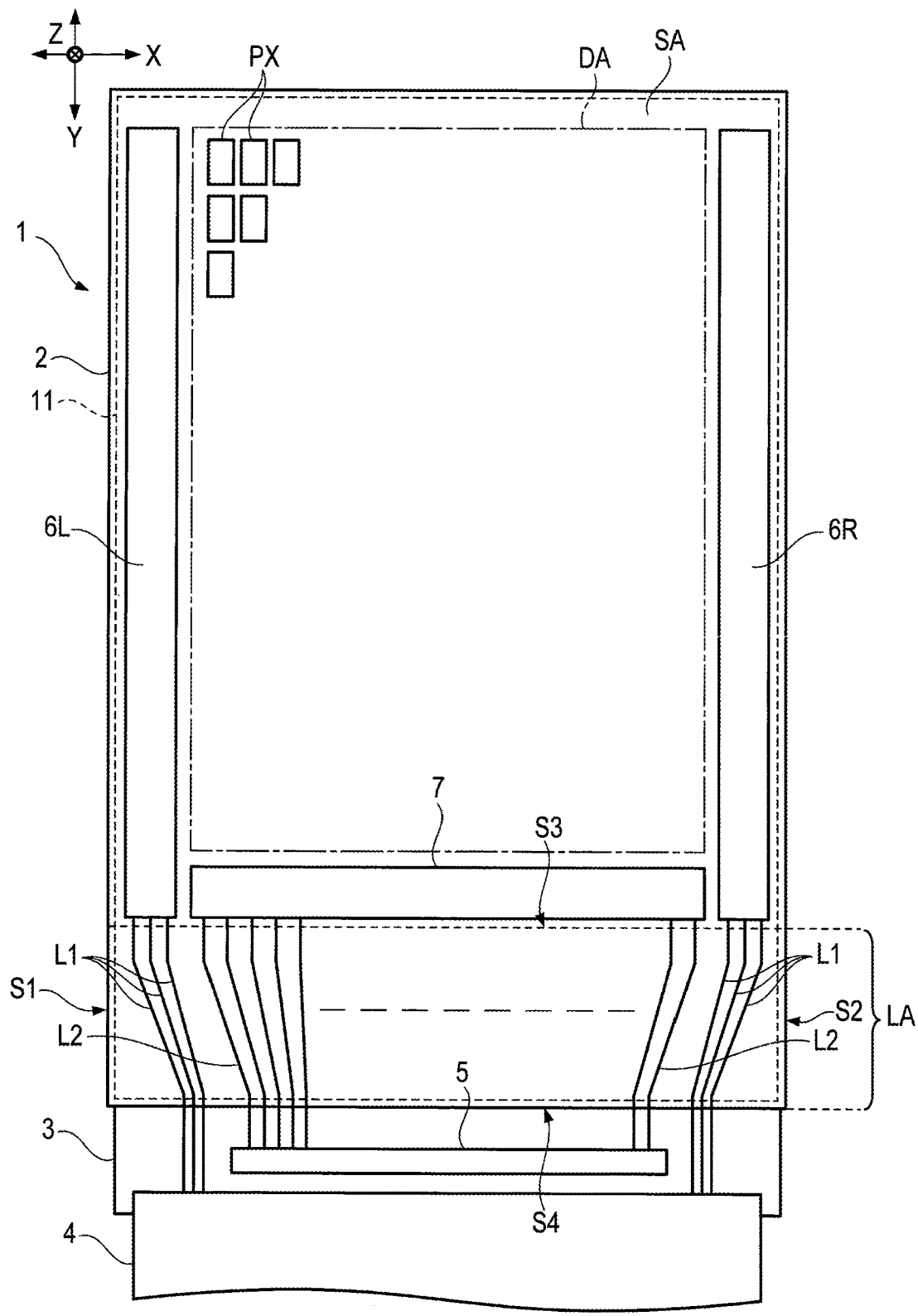
F I G. 1

DISPLAY DEVICE

CROSS-REFERENCE TO RELATED APPLICATIONS

This application is a continuation of U.S. application Ser. No. 15/631,300 filed Jun. 23, 2017, and is based upon and claims the benefit of priority from Japanese Patent Application No. 2016-125569, filed Jun. 24, 2016, the entire contents of each of which are incorporated herein by reference.

FIELD

Embodiments described herein relate generally to a display device.

BACKGROUND

Conventionally, in a display device such as an organic electroluminescent display device or a liquid crystal display device, a glass substrate is used as the base of a display panel. Recently, a flexible display device in which a resin substrate such as a polyimide resin substrate is used as the base of a display panel and flexibility is given to the display panel has been developed.

For example, in such a flexible display device, it is possible to reduce the size of a frame by bending toward a display area, a wiring area in which various wirings are formed outside the display area. In this case, however, the wirings are at risk of being damaged by stress resulting from the bending.

BRIEF DESCRIPTION OF THE DRAWINGS

FIG. 1 is a schematic plan view of a display device of a first embodiment.

DETAILED DESCRIPTION

Figure 2:
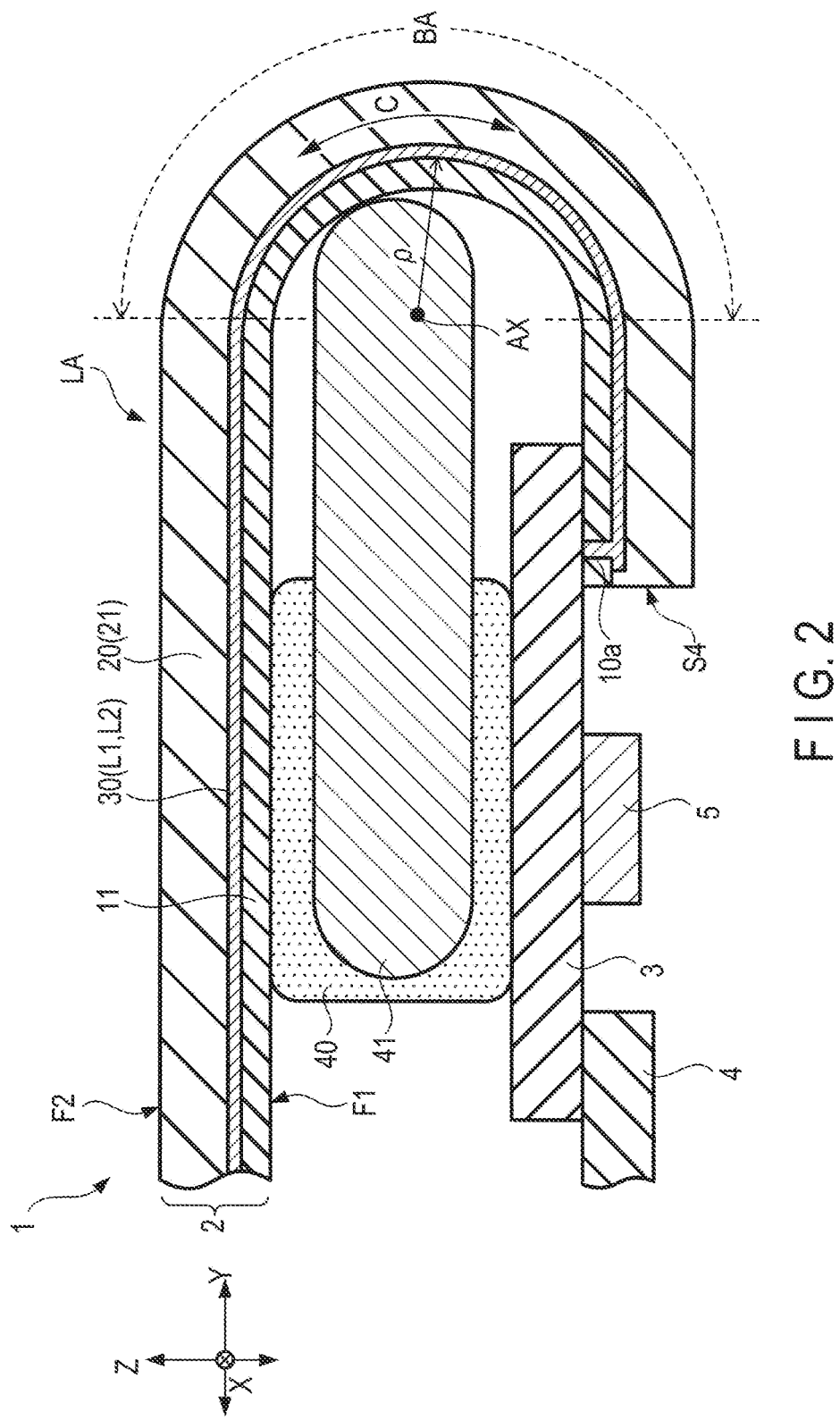
FIG. 2 is a diagram showing a state where a wiring area of the display device is folded.

In general, according to one embodiment, a display device includes: a first substrate including a first area including a display area in which pixels are arranged, a second area adjacent to the first area, and wirings; and an external circuit mounted on the second area of the first substrate. The wirings are electrically connected to the external circuit, provided in the first area and the second area, and arranged in the first direction. At least one of the wirings is inclined with respect to a second direction orthogonal to the first direction in a first portion of the second area. The first substrate is bent in the first portion.

According to this structure, it is possible to prevent damage of the wirings due to the bending of the second area and enhance reliability of the display device.

Embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the respective parts are illustrated in the drawings schematically, rather than as an accurate representation of what is implemented. However, such schematic illustration is merely exemplary and in no way restricts the interpretation of the invention. In the drawings, reference numbers of continuously arranged elements equivalent or similar to each other are omitted in some cases. In addition, in the specification and drawings, structural elements equivalent or similar to those described in connection with preceding drawings are denoted by the same reference numbers, and detailed description thereof is omitted unless necessary.

In each embodiment, a display device comprising an organic electroluminescent (EL) display element will be described as an example of a display device. However, each embodiment does not preclude application of individual technical ideas disclosed in the embodiment to display devices using other display elements. Here, the display elements include, for example, a display device comprising a liquid crystal display element, an electronic-paper type display device comprising an electrophoresis element, and the like.

First Embodiment

FIG. 1 is a schematic plan view of a display device 1 of the first embodiment. The display device 1 includes a display panel 2. The display panel 2 includes a display area DA and a surrounding area SA which surrounds the display area DA. In the display area DA, pixels PX are arranged in a matrix. In the present embodiment, the pixel PX includes an organic EL element and a switching element (thin-film transistor). For example, the organic EL element includes a pixel electrode connected to the switching element, and an organic luminescent layer which emits light according to voltage between the pixel electrode and a common electrode provided across a plurality of pixels PX.

In the surrounding area SA, the display panel 2 includes vertical drivers 6L and 6R and a horizontal diver 7. In FIG. 1, the vertical driver 6L is formed along the left side of the display area DA, and the vertical driver 6R is formed along the right side of the display area DA. The horizontal driver 7 is formed along the lower side of the display area DA. Each of the drivers 6L, 6R and 7 is a peripheral circuit and drives each pixel PX under control of a driver IC 5.

The display panel 2 further includes a wiring area LA provided on the lower side of the horizontal driver 7 in the drawing, and wirings L1 and L2 formed in the wiring area LA. For example, the wirings L1 and L2 are formed of a metal material. In the example shown in FIG. 1, three wirings L1 extend from each of the vertical drivers 6L and 6R, and numerous wirings L2 extend from the horizontal driver 7. For example, the wiring L1 is a power supply line which supplies a drive voltage to each of the vertical drivers 6L and 6R. For example, the wiring L2 is a signal line which supplies an image signal for driving each pixel PX. In the wiring area LA, wirings other than the wirings L1 and L2 may also be formed. The wiring area LA may also be referred to as an outer lead bonding (OLB) pad.

Each of the wirings L1 and L2 is arranged in an X direction (arrangement direction). Further, each of the wirings L1 and L2 extends in a Y direction either linearly or windingly. In the present embodiment, the X direction and the Y direction are orthogonal to each other in planar view. However, the X direction and the Y direction may cross each other at an angle other than a right angle.

Note that the direction (thickness direction of the display panel 2) orthogonal to the X direction and the Y direction is defined as a Z direction. Further, both sides of the wiring area LA arranged in the X direction will be referred to as a first side S1 and a second side S2, and both sides of the wiring area LA arranged in the Y direction will be referred to as a third side S3 and a fourth side S4. In the example shown in FIG. 1, the sides S1 and S2 correspond to the left and right short sides of the wiring area LA, and the sides S3 and S4 correspond to the upper and lower long sides of the wiring area LA. The third side S3 is located between the fourth side S4 and the display area DA.

The display device 1 further includes a first circuit board 3, a second circuit board 4, and the driver IC 5. In the vicinity of the fourth side S4, the first circuit board 3 is connected to the display panel 2, for example, via an anisotropic conductive film. The second circuit board 4 is connected to the first circuit board 3, for example, via an anisotropic conductive film. The first circuit board 3 and the second circuit board 4 are, for example, flexible printed circuits (FPCs). The driver IC 5 is a controller which controls the drivers 6L, 6R and 7 and is mounted on the first circuit board 3, for example, by a chip-on-film (COF) method. Note that, in the present embodiment, the first circuit board 3, the second circuit board 4, and the driver IC 5 correspond to external circuits.

Each wiring L1 is connected to the second circuit board 4 via the first circuit board 3. Each wiring L2 is connected to the driver IC 5 on the first circuit board 3. To the second circuit substrate 4, various signals and power are supplied from the controller of an electronic device on which the display device 1 is mounted.

The display panel 2 includes a flexible substrate 11. For example, the flexible substrate 11 includes the display area DA, the surrounding area SA, and the wiring area LA. As the flexible substrate 11, for example, a polyimide substrate can be used. Note that the flexible substrate 11 may be formed of another resin. Note that, the flexible substrate 11 corresponds to a first substrate, and in the present embodiment, the display area DA and the surrounding area SA correspond to a first area, and the wiring area LA corresponds to a second area.

The display device 1 having the above-described structure can be mounted on the electronic device, for example, in a state where the wiring area LA is folded. FIG. 2 is a schematic diagram showing a state where the wiring area LA is folded. Here, the figure shows a cross-section of the display device 1 taken parallel to the Y-Z plane.

In the wiring area LA, the display panel 2 includes the flexible substrate 11, a protection layer 20, and a wiring layer 30. The wiring layer 30 is a layer including the above-described wirings L1 and L2 and is formed on the flexible substrate 11. The protection layer 20 is a layer covering the wiring layer 30 and includes a protection film 21 formed of an insulating resin material. Note that, in addition to the wiring layer 30, another layer may be further provided between the flexible substrate 11 and the protection layer 20.

Similarly, the protection layer 20 may further include another layer in addition to the protection film 21.

The display panel 2 has a first surface F1 and a second surface F2 which is opposite to the first surface F1. In the wiring area LA, the first surface F1 corresponds to the back surface of the flexible substrate 11, and the second surface F2 corresponds to the front surface of the protection layer 20. In the display area DA shown in FIG. 1, the second surface F2 corresponds to the display surface.

Note that, in the display area DA, various insulating layers, semiconductor layers, metal layers, pixel electrodes, common electrodes, organic luminescent layers, polarizing layers, and the like are arranged on the flexible substrate 11. These elements may partially extend in the wiring area LA shown in FIG. 2.

The first circuit board 3 is connected to the first surface F1 of the display panel 2. For example, as shown in the drawing, the wiring layer 30 (each of the wirings L1 and L2) is connected to the first circuit board 3 via a through hole 10a provided in the flexible substrate 11. Note that the first circuit board 3 may also be connected to the second surface F2 of the display panel 2.

Each of the wirings L1 and L2 of the wiring layer 30 has a multilayer structure in which a titanium (Ti) layer having a thickness of 0.1 μm, an aluminum (Al) layer having a thickness of 0.5 μm, and a titanium layer having a thickness of 0.05 μm are stacked in this order. Note that each of the wirings L1 and L2 of the wiring layer may also have a multilayer structure of other materials.

In the wiring area LA, the display panel 2 is bent at 180 degrees in such a manner that the flexible substrate 11 will be placed on the inner side of the bend. At this time, the axis AX of the bending is, for example, parallel to the X direction. The display panel 2 may also be bent at another angle such as an angle of 90 degrees.

An adhesive layer 40 is formed between the first circuit board 3 and the first surface F1 of the display panel 2 which are opposed to each other. The first circuit substrate 3 and the first surface F1 are attached to each other by the adhesive layer 40, and the display panel 2 is maintained to be folded, accordingly. In the example shown in FIG. 2, a spacer 41 is supported by the adhesive layer 40. The end of the spacer 41 is smoothly rounded and is brought into contact with the first surface F1. As the spacer 41 is provided, the folded state of the wiring area LA can be stably maintained, and the curvature of the folded wiring area LA can be easily controlled.

In the following description, a portion of the flexible substrate 11 located in the wiring area LA and having curvature will be referred to as a bend area BA. Further, assuming the bend axis AX as the center of curvature in the Y-Z plane, the direction along the curve will be referred to as a C direction. In the present embodiment, the X direction corresponds to a first direction, and the Y direction and the C direction correspond to a second direction. In the bend area BA, tensile stress and compressive stress are produced. The maximum tensile stress is applied to the second surface F2, and the maximum compressive stress is applied to the first surface F1. When the tensile stress or the compressive stress is applied to the wiring layer 30, there is a possibility of the wirings L1 and L2 of the wiring layer 30 being damaged and broken. Note that, in the present embodiment, the bend area BA corresponds to a first portion.

In the thickness direction of the display panel 2, there is a neutral plane in which both of the above-described compressive stress and tensile stress are zero. It is possible to adjust the radius of curvature ρ of the neutral plane by adjusting the thicknesses of the flexible substrate 11 and the protection film 20. Therefore, if the thicknesses of the flexible substrate 11 and the protection layer 20 are determined such that the wiring layer 30 coincides with the neutral plane, the stress will not be applied to the wiring layer 30, and consequently the damage of the wirings L1 and L2 can be prevented.

However, it is difficult to align the conductive layer 30 with the neutral plane across the entire bend area BA. In particular, the central area and the peripheral area in the direction along the bend axis AX (X direction) have different deformation characteristics, and in the peripheral area, the neutral plane tends to have a substantially smaller radius of curvature ρ. Accordingly, tensile stress is applied to the wiring layer 30 in the peripheral area, and the wirings L1 and L2 tend to be damaged by the stress.

Figure 3:
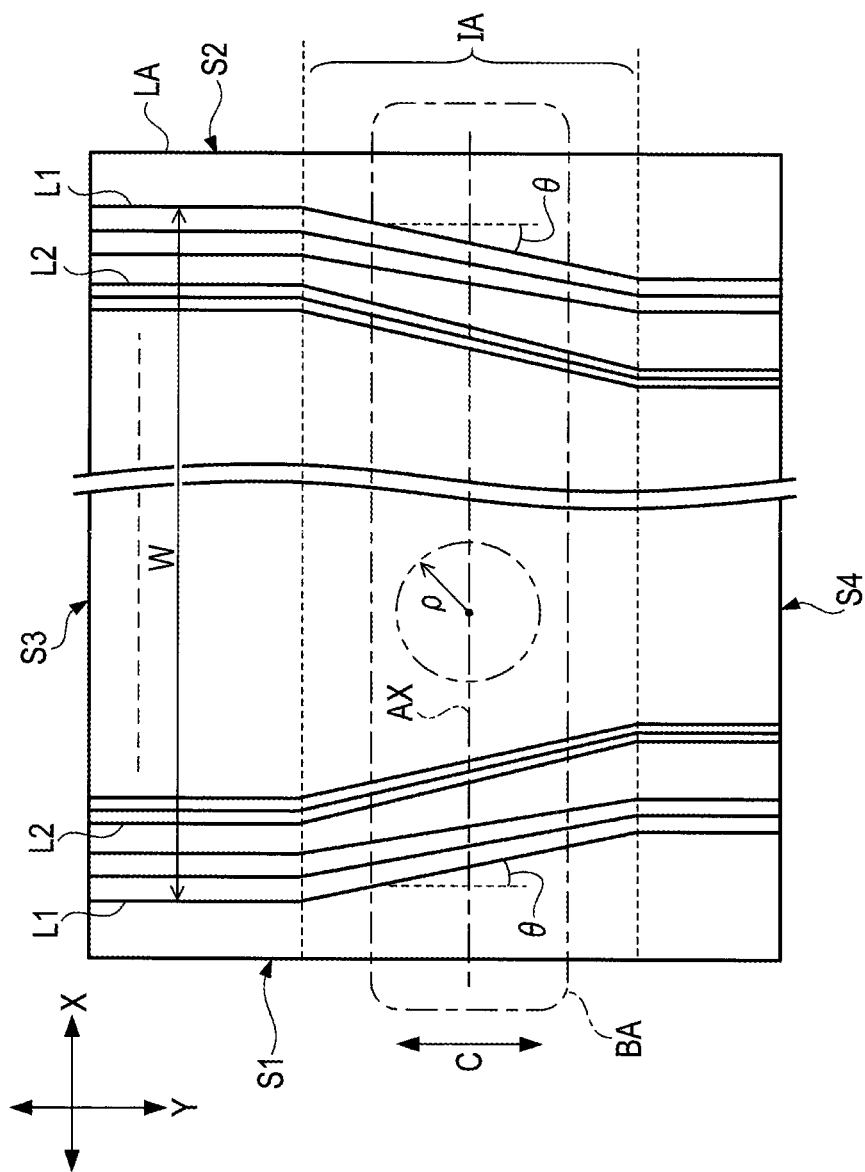
FIG. 3 is a schematic plan view of the wiring area.
Figure 4:
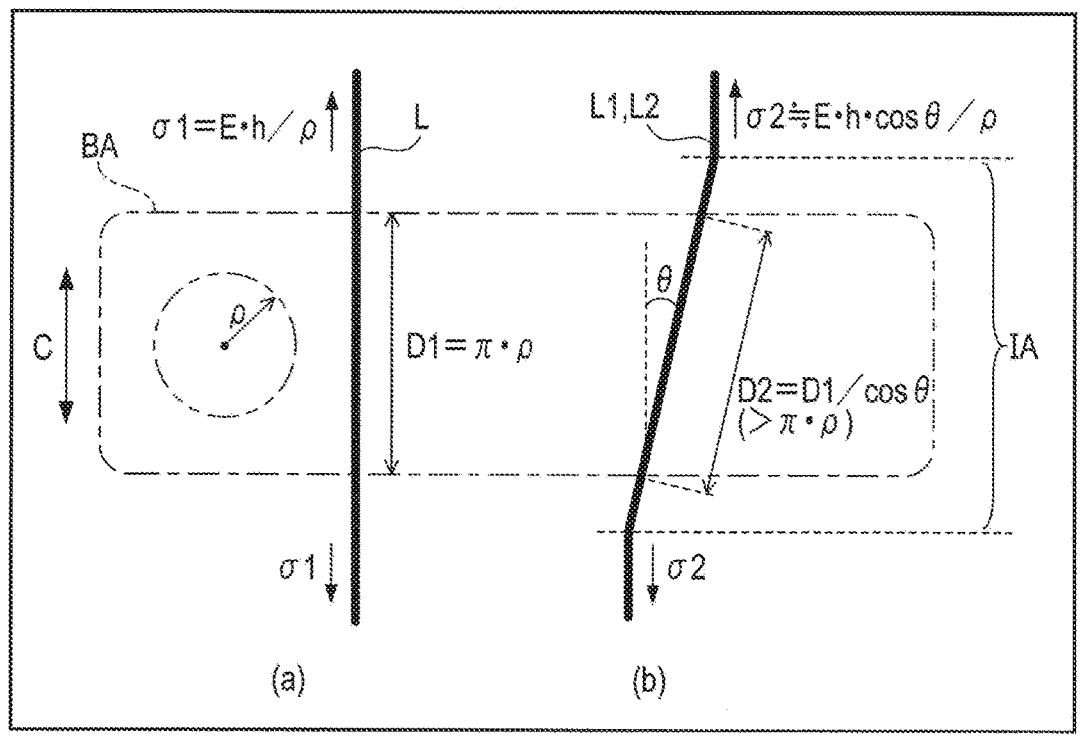
FIG. 4 is an explanatory diagram showing an effect of the wiring area.

A structure for preventing the damage of each of the wirings L1 and L2 will be described with reference to FIGS. 3 and 4. FIG. 3 is a schematic plan view of the wiring area LA. At the time of being mounted, as shown in FIG. 2, the wiring area LA in the bend area BA will be folded.

In the example shown in FIG. 3, the wiring area LA includes an integration area IA in which the wirings L1 and the wirings L2 are integrated, respectively. In the integration area IA, a width W between the wiring L1 closest to the side S1 and the wiring L1 closest to the side S2 decreases with increasing distance from the third side S3.

Outside the integration area IA, the wirings L1 and L2 extend parallel to the Y direction. On the other hand, in the integration area IA, the wirings L1 and L2 extend in a direction which crosses the Y direction (in the bend area BA, the C direction orthogonal to the bend axis AX) at an angle θ. The angle θ is an angle other than a right angle. For example, each of the wirings L1 and L2 closer to each of the sides S1 and S2 crosses at a larger angle θ, and each of the wirings L1 and L2 closer to the center in the X direction crosses at a smaller angle θ. The angle θ for the wirings L1 closest to the sides S1 and S2 should be an angle of 10 degrees or more and less than 90 degrees, more desirable, an angle of 30 degrees or more and less than 90 degrees. Note that at least one of the wirings L1 and L2 in the bend area BA is formed in such a manner that the wirings L1 and L2 do not orthogonally cross the X direction.

In the example shown in FIG. 3, spaces are provided between the third side S3 and the integration area IA and between the fourth side S4 and the integration area IA, respectively. Note that one or both of these spaces may not be provided.

To reduce the stress to be applied to the wirings L1 and L2, the bend area BA should preferably be set to a range where the wirings L1 and L2 are highly integrated, more desirable, a range where the wirings L1 and L2 are most highly integrated. Here, the degree of integration corresponds to the rate of change of the width W in the Y direction (or the C direction). A degree of integration can be represented as $\Delta w/\Delta c$ where $\Delta c$ is a length of the bend area BA in the C direction and $\Delta w$ is a change rate of the width W in an interval $\Delta c$. In the example shown in FIG. 3, the integration area IA has the highest degree of integration. Therefore, the bend area BA is set in such a way as to overlap the integration area IA.

An effect of the wiring area LA having the above-described structure will be described with reference to FIG. 4. FIG. 4(a) shows a wiring L of a comparative example, while FIG. 4(b) shows either of the wirings L1 and L2 of the present embodiment.

The wiring L shown in FIG. 4(a) extends parallel to the C direction in the bend area BA. Assuming that the wiring L is deviated from the neutral plane, a tensile stress σ1 to be applied to the wiring L in the bend area BA can be represented as $\sigma 1 = E \cdot \varepsilon = E \cdot h/\rho$ where E is a Young's modulus of the wiring L, ε is a strain, h is a distance from the neutral plane to the wiring L in the radius direction, and ρ is a radius of curvature of the neutral plane. Further, when the wiring area LA is bent at 180 degrees in the bend area BA, a length D1 of the wiring L in the bend area BA can be represented as $D1 = \pi \cdot \rho$ where π is the circular constant.

On the other hand, the wiring L1 or L2 shown in FIG. 4(b) is inclined at an angle θ with respect to the C direction in the bend area BA. In this case, a tensile stress σ2 to be applied to the wiring L1 or L2 in the bend area BA can be represented as $\sigma 2 \approx E \cdot \varepsilon = E \cdot h \cdot \cos \theta / \rho$. Further, when the wiring area LA is bent at 180 degrees in the bend area BA, a length D2 of the wiring L1 or L2 in the bend area BA can be represented as $D2 = D1/\cos \theta$. That is, the effective radius of curvature of the wiring L1 or L2 will be greater than that of the case shown in FIG. 4(a). For example, the wiring L1 or L2 is on an elliptical orbit.

In the present embodiment, since 0<θ<90, σ1>σ2 is satisfied in the bend area BA. That is, it is possible to reduce the tensile stress to be applied to each of the wirings L1 and L2 by inclining each of the wirings L1 and L2 at the angle θ with respect to the C direction.

Further, as described above, in the highly integrated range, the angle between each of the wirings L1 and L2 and the C direction is increased. Therefore, it is possible to enhance the effect of reducing the stress to be applied to each of the wirings L1 and L2 by setting the bend area BA in the highly integrated range such as the integration area IA.

As described above, according to the present embodiment, it is possible to prevent damage of each of the wirings L1 and L2 and improve reliability of the display device 1 by reducing stress to be applied to each of the wirings L1 and L2. In addition to the above, various other favorable effects can be obtained from the present embodiment.

Second Embodiment

Figure 5:
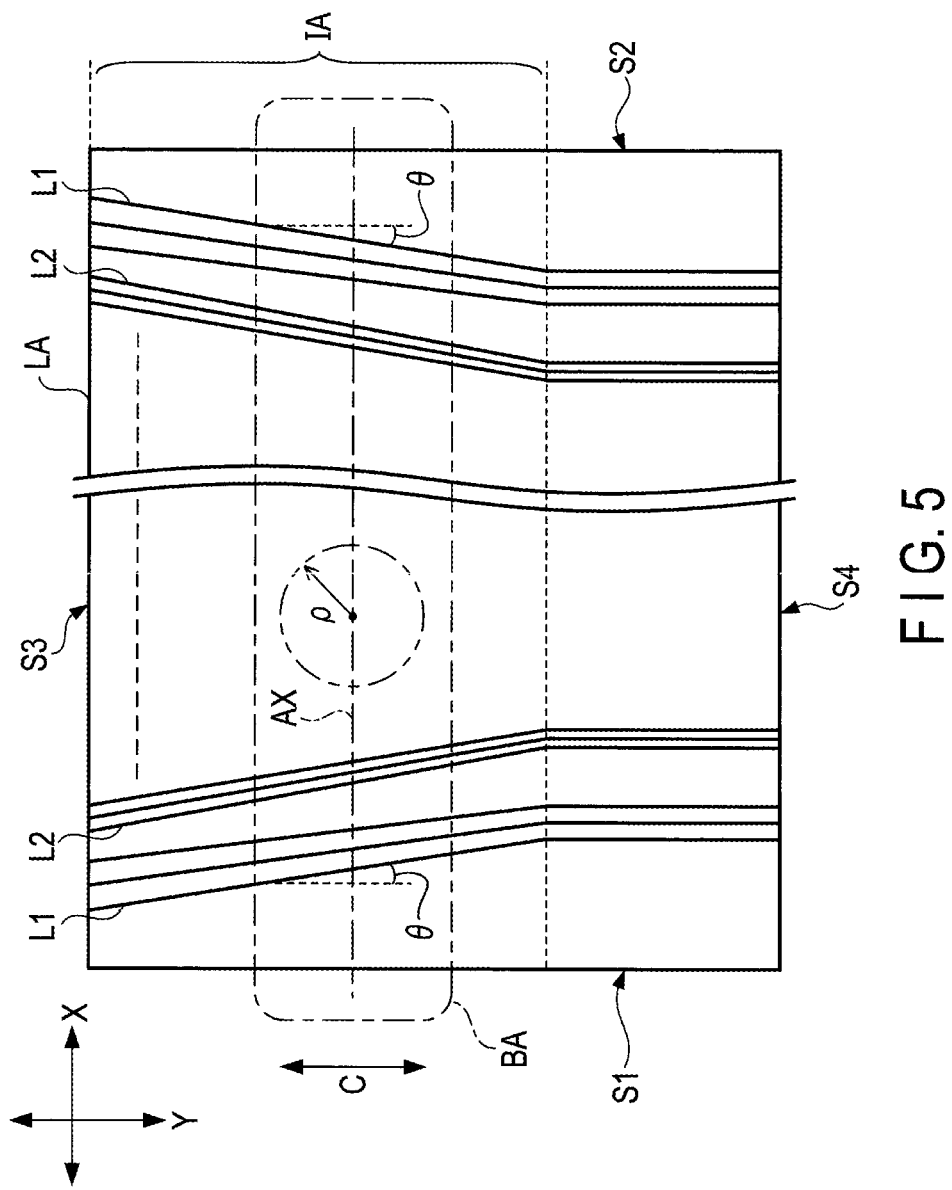
FIG. 5 is a schematic plan view of a wiring area of a second embodiment.

FIG. 5 is a schematic plan view of the wiring area LA of the second embodiment. In the example shown in the drawing, no space is provided between the integration area IA and the third side S3. According to this structure, since the wirings L1 and L2 are highly integrated near the third side S3 also, the bend area BA can be set in a location near the third side S3. Therefore, in a state where the wiring area LA is folded, the frame of the display device 1 will be further reduced in size.

Note that, in the example shown in FIG. 5, the space between the integration area IA and the fourth side S4 may not be provided.

Third Embodiment

The third embodiment is different from the above-described embodiments in terms of the shape of each of the wirings L1 and L2.

Figure 6:
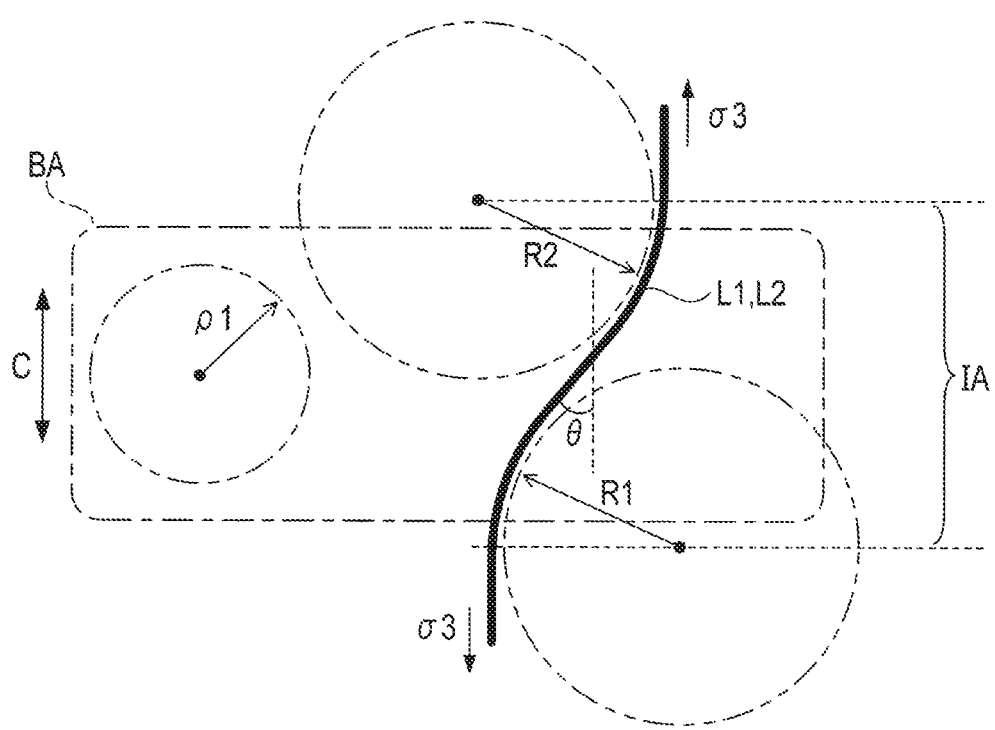
FIG. 6 is a diagram showing a shape of a wiring of a third embodiment.

FIG. 6 is a diagram showing the shape of each of the wirings L1 and L2 of the third embodiment. In planar view of the wiring area LA, each of the wirings L1 and L2 is gently curved in the wiring layer 30.

More specifically, each of the wirings L1 and L2 has two bend portions within the integration area IA. The radius of curvature of one bend portion is R1, and the radius of curvature of the other bend portion is R2. Between these two bend portions, each of the wirings L1 and L2 crosses the C direction at the above-described angle θ.

According to the shape shown in FIG. 6, in the same manner as those of the first and second embodiments, a tensile stress 3σ to be applied to each of the wirings L1 and L2 can be reduced. For example, the tensile stress 3σ is intermediate between the tensile stresses 1σ and σ2 shown in FIG. 4 (σ2<σ3<σ1).

In the wiring L1 or L2 shown in FIG. 4(b), stress tends to be concentrated in such a location where the portion extending in the C direction and the portion inclined with respect to the C direction are connected to each other. On the other hand, when the bend portion is gently curved as shown in FIG. 6, such concentration of stress can be moderated.

The radii of the curvature R1 and R2 may be, for example, the same as each other. However, the radii of curvature R1 and R2 may be different from each other. To moderate the above-described stress concentration more effectively, the radii of curvature R1 and R2 (second radius of curvature) should preferably be greater than the radius of curvature ρ (first radius of curvature) of the bend area BA.

Figure 7:
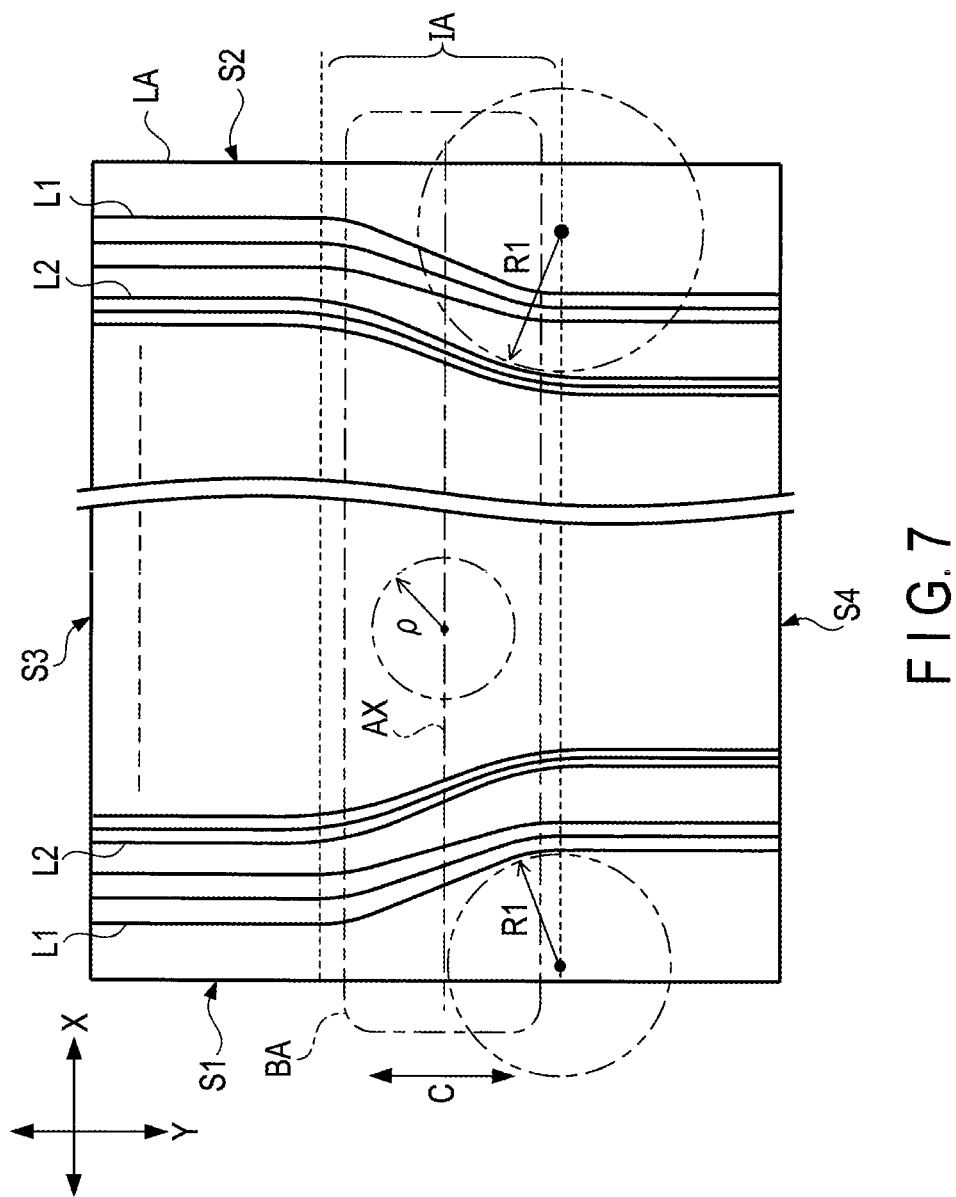
FIG. 7 is a schematic plan view of a wiring area using the wiring formed into the shape shown in FIG. 6.

FIG. 7 is a schematic plan schematically showing the wiring area LA using the wirings L1 and L2 formed into the shape shown in FIG. 6. In the example shown in the drawing, both the wirings L1 and the wirings L2 are gently curved in the integration area IA. The bend area BA overlaps the integration area IA.

In the example shown in FIG. 7, each of the wirings L1 and L2 closer to each of the sides S1 and S2 has a larger radius of curvature R1, and each of the wirings L1 and L2 closer to the center in the X direction has a smaller radius of curvature R1. The same also applies to the radius of curvature R2. Accordingly, each of the wirings L1 and L2 closer to each of the sides S1 and S2 crosses the C direction at a larger angle. Therefore, the stress to be applied, particularly, to the wirings L1 and L2 near the peripheral portions in the X direction can be reduced.

Note that, although each of the wirings L1 and L2 has two bend portions in the present embodiment, each of the wirings L1 and L2 may have only one bend portion. Alternatively, each of the wirings L1 and L2 may also have three or more bend portions.

Fourth Embodiment

Figure 8:
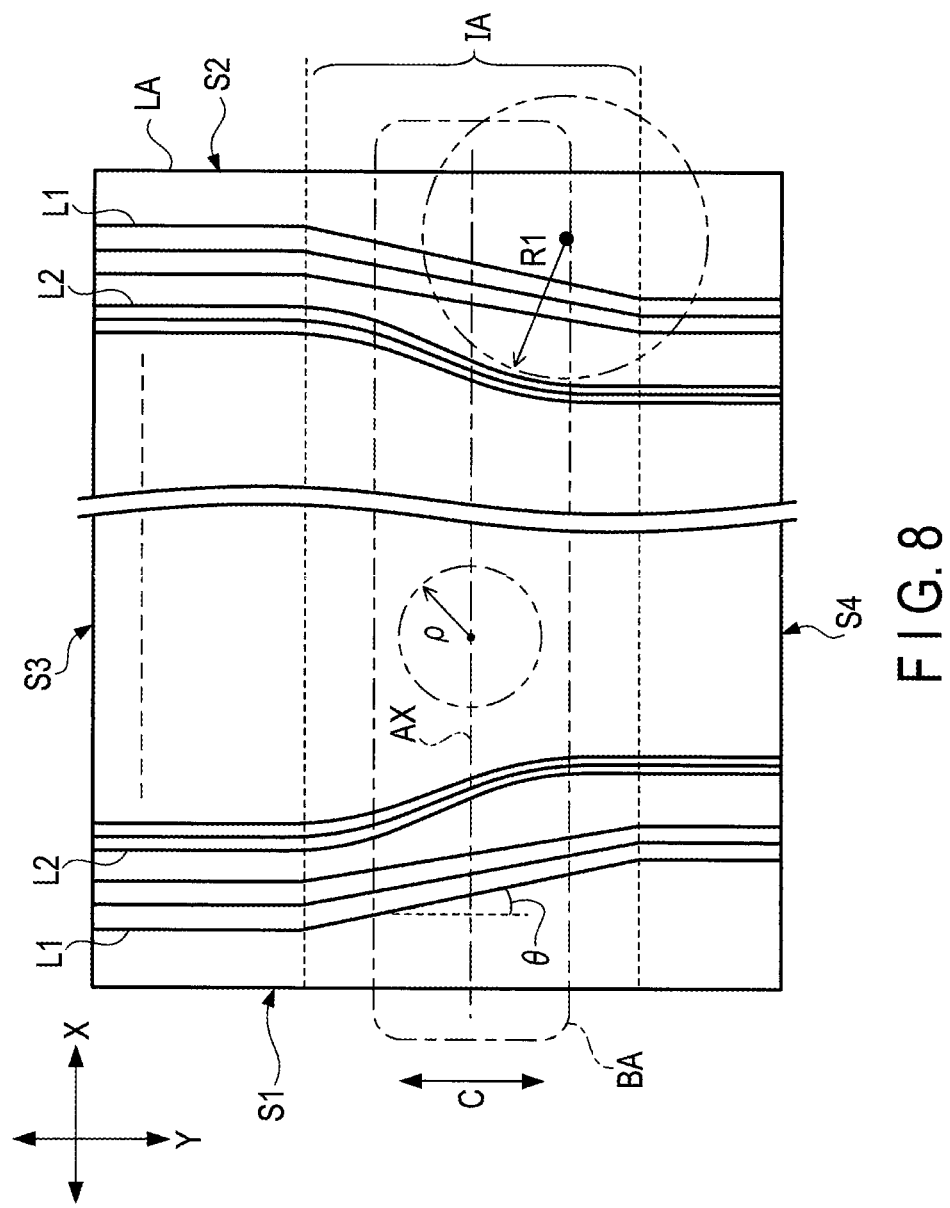
FIG. 8 is a schematic plan view of a wiring area of a fourth embodiment.

FIG. 8 is a schematic plan view of the wiring area LA of the fourth embodiment. In the example shown in the drawing, the shape of each wiring L1 is similar to that of the first embodiment shown in FIG. 3, and the shape of each wiring L2 is similar to that of the third embodiment shown in FIG. 7.

That is, each wiring L1 in the integration area IA is inclined at the angle θ to the C direction and extends linearly. On the other hand, each wiring L2 in the integration area IA is gently curved in two bend portions.

According to this structure, it is possible to have the same effect as that of the first embodiment on each wiring L1 and the same effect as that of the third embodiment on each wiring L2.

Fifth Embodiment

Figure 9:
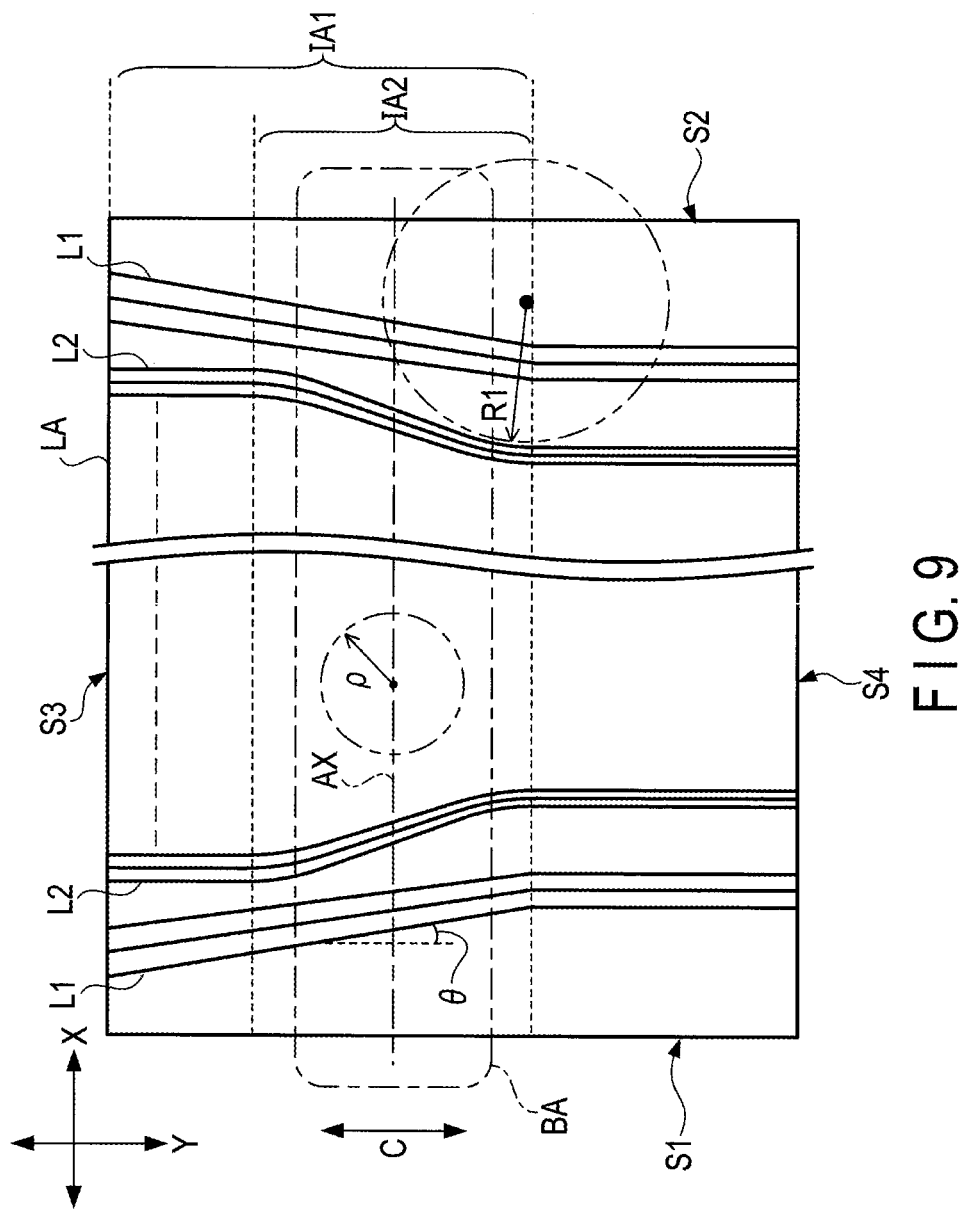
FIG. 9 is a schematic plan view of a wiring area of a fifth embodiment.

FIG. 9 is a schematic plan view of the wiring area LA of the fifth embodiment. In the example shown in the drawing, the shape of each wiring L1 is similar to that of the second embodiment shown in FIG. 5, and the shape of each wiring L2 is similar to that of the third embodiment shown in FIG. 7. Note that, in the present embodiment, the integration area IA varies between the wirings L1 and the wirings L2. In the following, the integration area of the wirings L1 will be referred to as an integration area IA1, and the integration area of the wirings L2 will be referred to as an integration area IA2.

Each wiring L1 in the integration area IA1 is inclined at the angle θ with respect to the C direction and extends linearly. No space is provided between the integration area IA1 and the third side S3. On the other hand, each wiring L2 in the integration area IA2 is gently curved in two bend portions. Spaces are provided between the integration area IA2 and the third side S3 and between the integration area IA2 and the fourth side S4, respectively. In the example shown in FIG. 9, the integration area IA2 is included in the integration area IA1.

According to this structure, it is possible to have the same effect as that of the second embodiment on each wiring L1 and the same effect as that of the third embodiment on each wiring L2.

The first to fifth embodiments can be appropriately combined with each other.

Although each embodiment has been described based on the assumption that one wiring layer 30 is formed in the wiring area LA, a plurality of wiring layers 30 may also be formed in the wiring area LA in such a manner that these wiring layers 30 are deviated from each other in the thickness direction of the wiring area LA. In that case, high tensile stress tends to be applied to the wiring layer 30 located on the outer side of the bend. Therefore, it is possible to set the outer wiring layer 30 as the control target of the neutral plane control by the method disclosed in the embodiment.

Further, all display devices which a person having ordinary skill in the art can implement by making appropriate design changes to the display devices described in the embodiments of the present invention will come within the scope of the present invention as long as they fall within the scope and spirit of the present invention.

Still further, it is natural for a person having ordinary skill in the art to conceive of various modifications of the present invention within the scope of the technical concept of the present invention, and such modifications will be encompassed by the scope and spirit of the present invention. For example, the above-described embodiments with appropriate addition, deletion and/or design change of the structural elements, or appropriate addition, omission and/or condition change of the manufacturing process by a person having ordinary skill in the art will also come within the scope of the present invention as long as they fall within the scope and spirit of the present invention.

Still further, concerning advantages other than those described in the embodiments, advantages obvious from the description of the present invention and advantages appropriately conceivable by a person having ordinary skill in the art will be regarded as the advantages achievable from the present invention as a matter of course.

What is claimed is:
1. An electronic device comprising:
   a first substrate including a first area including a plurality of switching elements, a second area adjacent to the first area, and wirings; and
   an external circuit mounted on the second area of the first substrate, wherein the wirings are electrically connected to the external circuit, provided in the first area and the second area, and arranged in a first direction, at least one of the wirings in planar view of a first portion of the second area is curved with respect to a second direction orthogonal to the first direction, the first substrate in the first portion is bent in a first radius of curvature, at least one of the wirings in planar view is bent in a second radius of curvature, and the second radius of curvature of the wirings increases from a peripheral portion of the second area to a central portion of the second area in the first direction.

2. The electronic device of claim 1, wherein the second area includes a first side parallel to the second direction, a second side opposed to the first side, a third side connecting the first side and the second side and parallel to the first direction, and a fourth side opposed to the third side and connecting the first side and the second side, and a width between the wiring closest to the first side and the wiring closest to the second side decreases with increasing distance from the third side.

3. The electronic device of claim 2, wherein the width between the wiring closest to the first side and the wiring closest to the second side in the first direction changes at a highest rate in the first portion.

4. The electronic device of claim 2, wherein the second area includes an integration area in which at least one of the wirings is inclined with respect to the second direction, the first portion overlaps the integration area, and spaces are provided between the integration area and the third side and between the integration area and the fourth side.

5. The electronic device of claim 2, wherein the second area includes an integration area in which at least one of the wirings is inclined with respect to the second direction, the first portion overlaps the integration area, and a space is provided between the integration area and the fourth side, and no space is provided between the integration area and the third side.

6. The electronic device of claim 2, wherein the wirings include first wirings and second wirings, and at least one of the first wirings is arranged between the second wirings and the first side, and the other first wirings are arranged between the second wirings and the second side.

7. The electronic device of claim 6, wherein the second area includes a first integration area in which the first wirings are inclined with respect to the second direction, and a second integration area in which the second wirings are inclined with respect to the second direction, and the first portion overlaps the first integration area and the second integration area.

8. The electronic device of claim 7, wherein a space is provided between the second integration area and the third side, and no space is provided between the first integration area and the third side.

9. The electronic device of claim 1, wherein the first substrate is bent along an axis parallel to the first direction.

10. The electronic device of claim 9, wherein the external circuit and the first substrate are attached to each other by an adhesive layer, and the first substrate is maintained to be bended.

11. The electronic device of claim 9, wherein the second direction is a direction orthogonal to the axis parallel to the first direction.

12. The electronic device of claim 1, wherein at least one of the wirings in the first portion crosses the second direction at an angle of 10 degrees or more.

13. The electronic device of claim 12, wherein at least one of the wirings in the first portion crosses the second direction at an angle of 30 degrees or more.

14. The electronic device of claim 1, wherein an angle at which the wirings cross the second direction increases from a central portion of the second area toward a peripheral portion of the second area in the first direction.

15. The electronic device of claim 1, wherein at least one of the wirings in the first portion does not orthogonally cross the first direction.

16. The electronic device of claim 1, wherein the second radius of curvature is greater than the first radius of curvature.

17. The electronic device of claim 16, wherein at least one of the wirings includes two or more bend portions which bend in the second radius of curvature.

18. The electronic device of claim 1, wherein the wirings have a multilayer structure of titanium, aluminum, and titanium.

* * * * *